United States Patent
Ko et al.

(10) Patent No.: US 6,808,992 B1
(45) Date of Patent: Oct. 26, 2004

(54) METHOD AND SYSTEM FOR TAILORING CORE AND PERIPHERY CELLS IN A NONVOLATILE MEMORY

(75) Inventors: Kelwin Ko, San Jose, CA (US); Shenqing Fang, Fremont, CA (US); Angela T. Hui, Fremont, CA (US); Hiroyuki Kinoshita, Sunnyvale, CA (US); Wenmei Li, Sunnyvale, CA (US); Yu Sun, Saratoga, CA (US); Hiroyuki Ogawa, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/150,240

(22) Filed: May 15, 2002

(51) Int. Cl.$^7$ ............................................. H01L 21/336
(52) U.S. Cl. ...................... 438/283; 438/201; 438/211; 438/239; 438/244; 438/250; 438/253; 438/257; 438/381; 438/387; 438/393; 438/396; 257/300; 257/302; 257/303; 257/306; 257/307; 257/314; 257/315
(58) Field of Search ................................ 438/283, 201, 438/211, 239–244, 250–257, 381–387, 393–396, 265; 257/297–313, 68, 71, 314–315

(56) References Cited

U.S. PATENT DOCUMENTS

| | | | | |
|---|---|---|---|---|
| 5,792,680 A | * | 8/1998 | Sung et al. | 438/210 |
| 5,874,342 A | * | 2/1999 | Tsai et al. | 438/301 |
| 5,933,730 A | * | 8/1999 | Sun et al. | 438/258 |
| 6,020,242 A | * | 2/2000 | Tsai et al. | 438/279 |
| 6,160,317 A | * | 12/2000 | Sun et al. | 257/900 |
| 6,248,629 B1 | * | 6/2001 | Liu et al. | 438/258 |
| 6,355,547 B1 | * | 3/2002 | Lee et al. | 438/586 |
| 6,525,368 B1 | * | 2/2003 | Fastow | 257/314 |
| 2001/0007365 A1 | * | 7/2001 | Lee | 257/296 |
| 2002/0130356 A1 | * | 9/2002 | Sung et al. | 257/316 |
| 2003/0085417 A1 | * | 5/2003 | Ramsbey et al. | 257/296 |

* cited by examiner

Primary Examiner—Matthew Smith
Assistant Examiner—Granvill D. Lee, Jr.
(74) Attorney, Agent, or Firm—Winstead Sechrest & Minick P.C.

(57) ABSTRACT

A method and system for providing a semiconductor device are described. The semiconductor device includes a substrate, a core and a periphery. The core includes a plurality of core gate stacks having a first plurality of edges, while the periphery a plurality of periphery gate stacks having a second plurality of edges. The method and system include providing a plurality of core spacers, a plurality of periphery spacers, a plurality of core sources and a plurality of conductive regions. The core spacers reside at the first plurality of edges and have a thickness. The periphery spacers reside at the second plurality of edges and have a second thickness greater than the first thickness. The core sources reside between the plurality of core gate stacks. The conductive regions are on the plurality of core sources. This method allows different thicknesses of the spacers to be formed in the core and the periphery so that the spacers can be tailored to the different requirements of the core and periphery.

16 Claims, 6 Drawing Sheets

METHOD AND SYSTEM FOR TAILORING CORE AND PERIPHERY CELLS IN A NONVOLATILE MEMORY

FIELD OF THE INVENTION

The present invention relates to semiconductor devices, and more particularly to a method and system for tailoring core and periphery cells in a nonvolatile memory.

BACKGROUND OF THE INVENTION

Conventional semiconductor devices, such as conventional nonvolatile memory devices, typically include a core region and a periphery region. The core typically includes cells of one type, such as nonvolatile memory cells. The periphery typically includes logic devices such as transistors. The cells in the core typically include a plurality of gate stacks. A source is positioned at one edge of each gate stack, while the drain is at the opposing edge of the gate stack. Each gate stack typically includes several gates, such as a floating gate and a control gate separated from the floating gate by an insulating layer such as oxynitride oxide (ONO). Other layers such as a Wsi, and polysilicon and SiN capping layers may also be provided. The floating and control gates are typically made of polysilicon. The gate stacks at the periphery typically include a single polysilicon gate. Periphery sources and drains are generally located at opposing edges of the periphery gate stacks. Spacers are also located at the edges of the core and periphery gate stacks.

In order to fabricate the conventional semiconductor device, the gate stacks at the core and periphery are generally formed first. A nitride layer is deposited over the core and the periphery. The spacers formed are composed of the nitride layer. A mask which exposes only the source and drain regions of the core is provided. The source and drain for the core are then implanted. In addition, an LDD mask and implant are provided for the periphery. The nitride layer is then etched at the core and the periphery, using a mask which exposed the source and drain regions at the core and the periphery. The spacers at the core and the periphery are, therefore, formed concurrently. The periphery sources and drain implant is then provided. Processing of the semiconductor device can then be completed.

Although the conventional method for forming the cells in a semiconductor device functions, one of ordinary skill in the art will readily recognize that the conventional method results in spacers which are the same at the core and the periphery. Thus, the spacers at the core have the same thickness as the spacers at the periphery. The spacers at the periphery are desired to be thick to separate the source and drain implant from the gate stacks in the periphery, thereby avoiding the hot carrier effect. However, the spacers at the core need not be as thick as the spacers at the periphery. Consequently, the spacers at the core may be thicker than desired. As a result, cells in the core may be larger than desired. Furthermore, is the spacers may fill the region above the sources in the core making it difficult to form silicided source lines.

Accordingly, what is needed is a system and method for providing a semiconductor device having spacers tailored to their function. The present invention addresses such a need.

SUMMARY OF THE INVENTION

The present invention provides a method and system for providing a semiconductor device. The semiconductor device includes a substrate, a core and a periphery. The core includes a plurality of core gate stacks having a first plurality of edges, while the periphery a plurality of periphery gate stacks having a second plurality of edges. The method and system comprise providing a plurality of core spacers, a plurality of periphery spacers, a plurality of core sources and a plurality of conductive regions. The plurality of core spacers resides at the first plurality of edges and has a thickness. The plurality of periphery spacers resides at the second plurality of edges and has a second thickness greater than the first thickness. The plurality of core sources resides between the plurality of core gate stacks. The plurality of conductive regions is on the plurality of core sources.

According to the system and method disclosed herein, the present invention allows the spacers for the core and the periphery to be individually tailored. Thus, for example, the core sources can be exposed for a CoSi layer, which reduces the resistance of the core source lines.

DETAILED DESCRIPTION OF THE INVENTION

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein. The present invention provides a method and system for providing a semiconductor device. The semiconductor device includes a substrate, a core and a periphery. The core includes a plurality of core gate stacks having a first plurality of edges, while the periphery a plurality of periphery gate stacks having a second plurality of edges. The method and system comprise providing a plurality of core spacers, a plurality of periphery spacers, a plurality of core sources and a plurality of conductive regions. The plurality of core spacers resides at the first plurality of edges and has a thickness. The plurality of periphery spacers resides at the second plurality of edges and has a second thickness greater than the first thickness. The plurality of core sources resides between the plurality of core gate stacks. The plurality of conductive regions is on the plurality of core sources.

The present invention will be described in terms of methods including particular steps. Furthermore, for clarity, some steps are omitted. One of ordinary skill in the art will, therefore, readily recognize that this method and system will operate effectively for other methods having different and/or additional steps. The present invention is also described in conjunction with a particular nonvolatile memory device having certain components. However, one of ordinary skill in the art will readily recognize that the present invention is consistent with a semiconductor device having other and/or different components.

Figure 1:
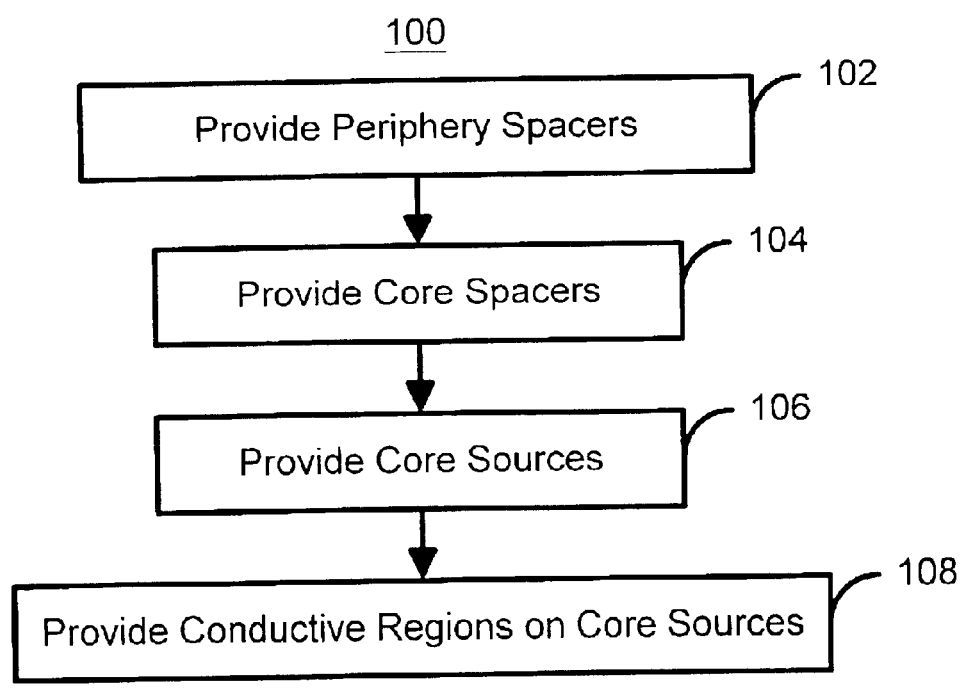
FIG. 1 is a high-level flow chart of one embodiment of a method in accordance is with the present invention for providing a semiconductor device having tailored spacers.

To more particularly illustrate the method and system in accordance with the present invention, refer now to FIG. 1, depicting a high-level flowchart of one embodiment of a method 100 in accordance with the present invention for providing a semiconductor device. The method 100 preferably commences after the gate stacks at the periphery and the core have been formed. The core gate stacks preferably include two polysilicon layers separated by an insulating layer, that is preferably composed of ONO. The first polysilicon layer preferably resides on a thin insulating layer. A WSi layer preferably resides on the second polysilicon layer. The WSi layer is preferably covered by a polysilicon capping layer, which is covered by a SiN layer. The periphery gate stacks preferably include a polysilicon layer on a thin insulating layer. In a preferred embodiment, the polysilicon layer in the periphery gate stack is fabricated from the same polysilicon as the second polysilicon layer in the core gate stacks.

The periphery spacers are provided at the edges of the periphery gate stacks, via step 102. Core spacers are provided at the edges of the core gate stacks, via step 104. Core sources which resides between part of the core gate stacks are provided, via step 106. In a preferred embodiment, step 106 also includes providing core drains. Thus, core sources are at one edge of a particular gate stack, while core drains are at the other edge of the particular gate stack. Conductive regions are provided on the core sources, via step 108. Preferably, the conductive regions are CoSi regions formed on the core sources.

The core spacers provided in step 104 are thinner than the periphery spacers in step 102. In a preferred embodiment the periphery spacers are formed from a first and a second layer of insulating material, while the core spacers are formed from the first layer of insulating material. As a result, the core spacers are thinner. Furthermore, portions of the core sources can be exposed because the core spacers are thinner. As a result, the conductive regions can be formed, reducing the resistance of the core source regions.

Figure 2:
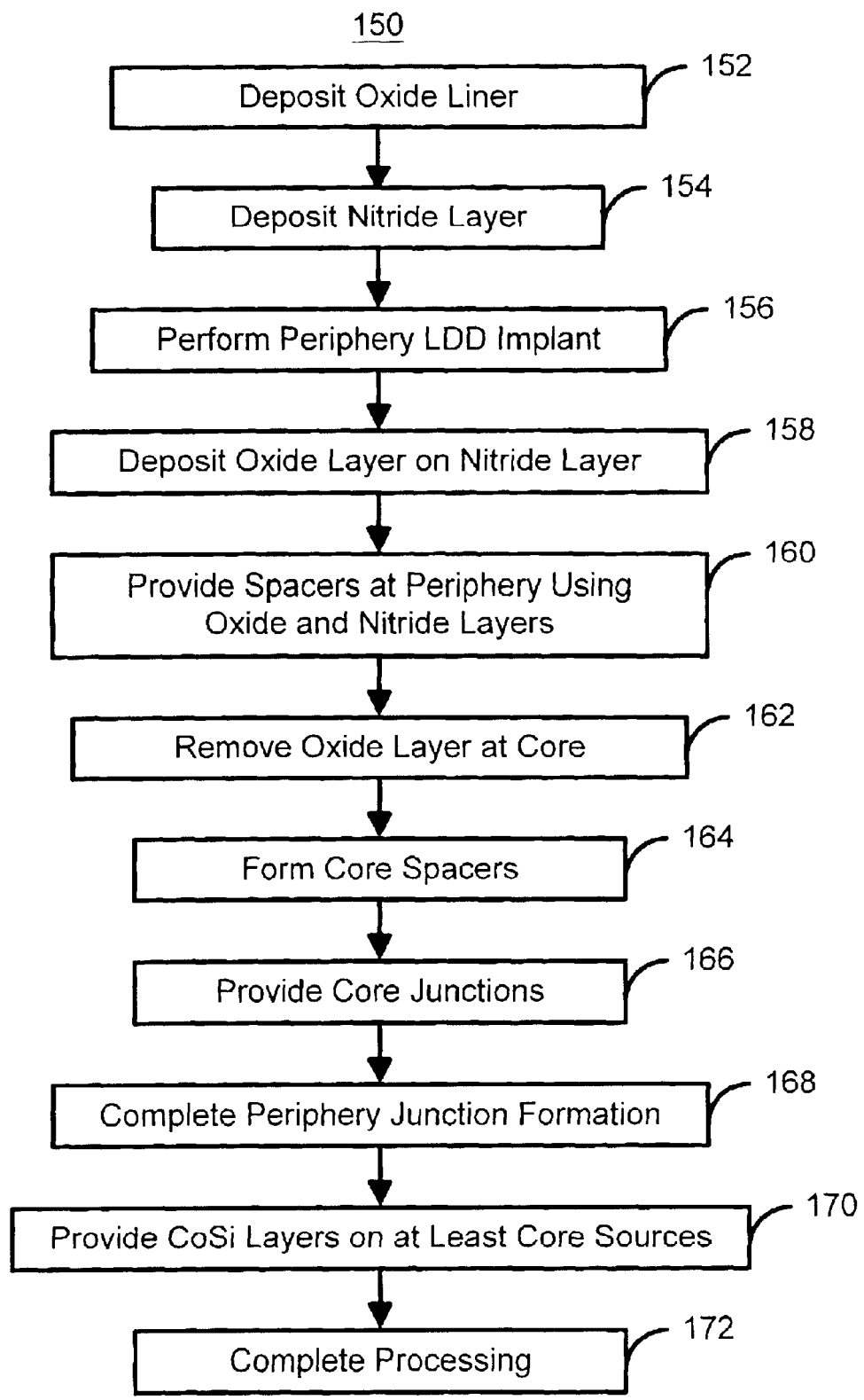
FIG. 2 is a more detailed flow chart of one embodiment of a method in accordance with the present invention for providing a semiconductor device having tailored spacers.
Figure 3A:
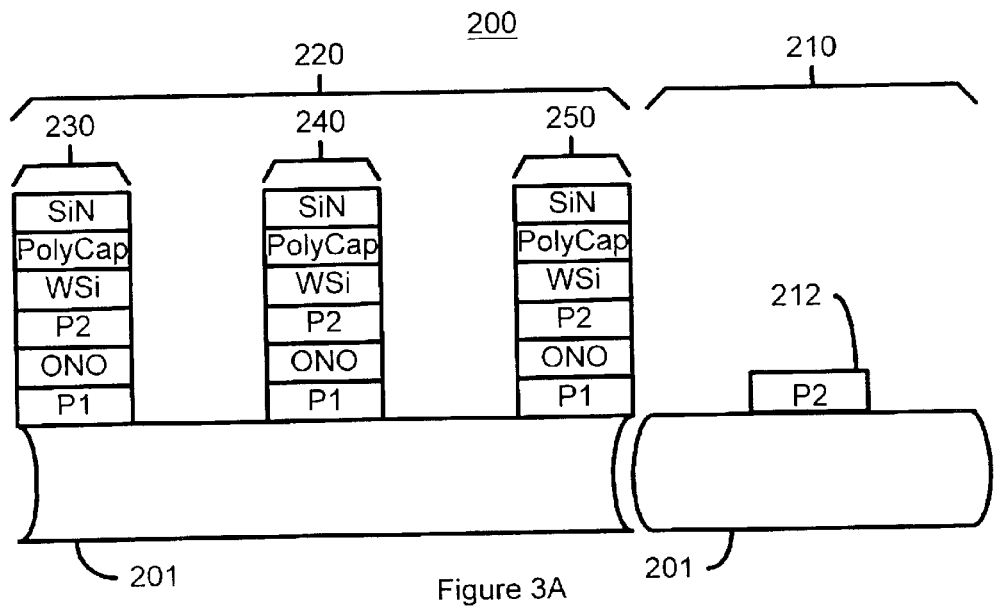
FIGS. 3A–3H depict one embodiment of a semiconductor device in accordance with the present invention.

FIG. 2 is a more detailed flow chart of one embodiment of a method 150 in accordance with the present invention for providing a semiconductor device having tailored core and periphery cells. FIGS. 3A–3H depict one embodiment of a semiconductor device 200 in accordance with the present invention during fabrication. Consequently, the method 150 is described in conjunction with the semiconductor device 200. Referring to FIGS. 2 and 3A–3H, the method 150 preferably commences after the gate stacks at the periphery and the core have been formed. The core gate stacks preferably include two polysilicon layers separated by an insulating layer, that is preferably composed of ONO. The first polysilicon layer preferably resides on a thin insulating layer (not shown). A WSi layer preferably resides on the second polysilicon layer. The WSi layer is preferably covered by a polysilicon capping layer, which is covered by a SiN layer. The periphery gate stacks preferably include a polysilicon layer on a thin insulating layer. In a preferred embodiment, the polysilicon layer in the periphery gate stack is fabricated from the same polysilicon as the second polysilicon layer in the core gate stacks. FIG. 3A depicts the semiconductor device having a periphery 210 and a core 220. The semiconductor device is preferably a nonvolatile memory device. Also depicted are core gate stacks 230, 240 and 250 and periphery gate stack 212.

Figure 3B:
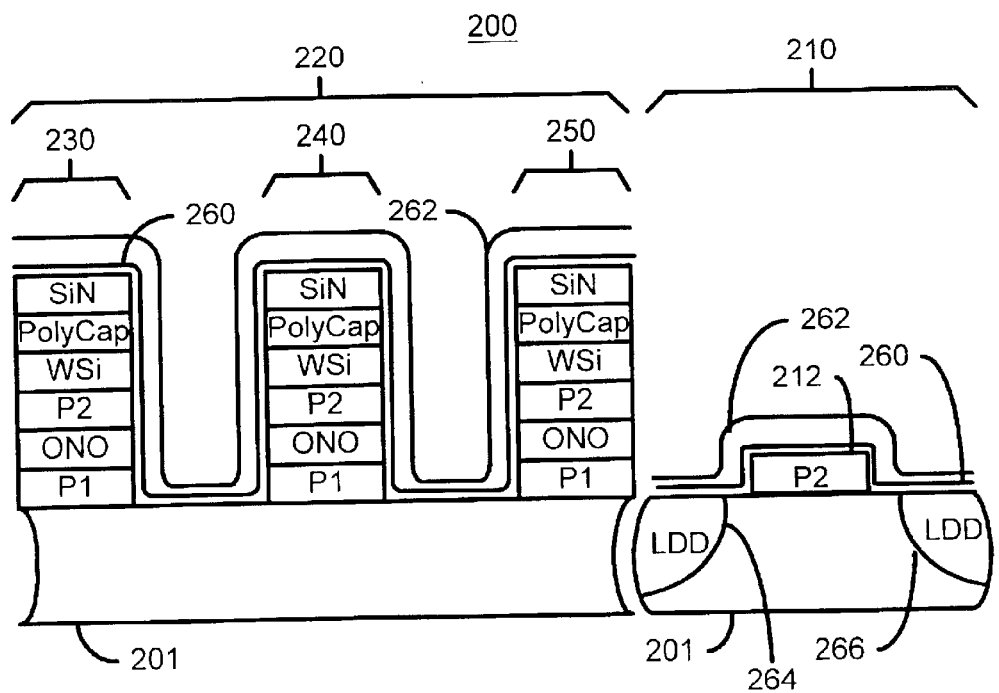

An oxide liner is deposited on the core 220 and the periphery 210, via step 152. A nitride layer is provided on the oxide layer, via step 154. An LDD implant is provided at the periphery, via step 156. FIG. 3B depicts the semiconductor device after deposition of the oxide liner 260 and the nitride layer 262 and after the LDD implant has been provided. Thus, the periphery includes LDD regions 264 and 266 that will become part of the periphery source and drain, respectively. Note that for clarity, the oxide liner 260 is depicted only in FIGS. 3B and 3C. However, in a preferred embodiment, the oxide liner 260 is part of the core and periphery spacers formed using the method 150.

Figure 3C:
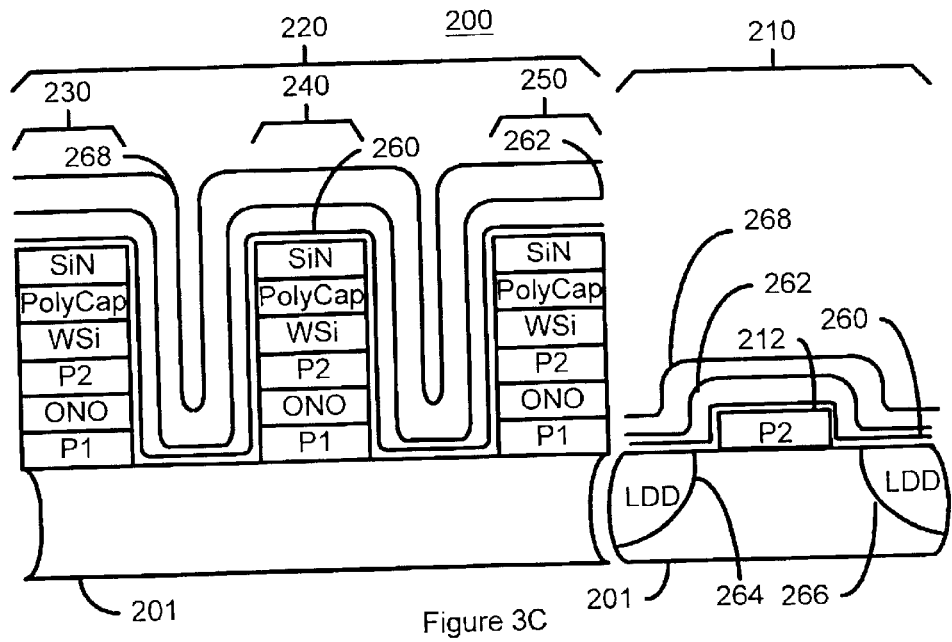
Figure 3D:
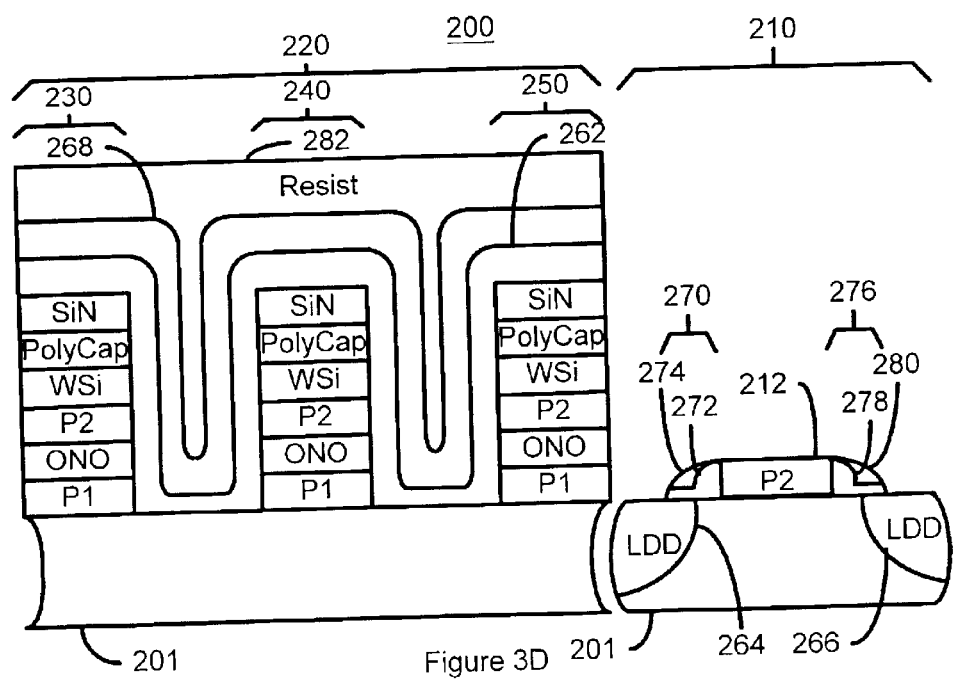

An oxide layer is deposited on the core 220 and the periphery 210, via step 258. FIG. 3C depicts the semiconductor device 200 after deposition of the oxide layer 268. The oxide layer 268 is thus on the nitride layer 262 at both the core 220 and the periphery 210. The periphery spacers are then formed, via step 160. Step 160 preferably includes providing a mask which protects the core and anisotropically etching the semiconductor device 200 to remove a portion of the oxide layer 268 and the nitride layer 262 at the periphery 210. FIG. 3D depicts the semiconductor device 200 after formation of the periphery spacers 270 and 276. The periphery spacers 270 and 276 include oxide layers 274 and 280, respectively, and nitride layer 272 and 278, respectively. However, the core 220 still includes the oxide layer 268 and nitride layer 264 because the core has been protected by the resist mask 282. In addition, the core 220 includes the oxide liner 260 (not shown). The periphery 210 also includes a residual oxide liner (not shown) underneath the spacers 270 and 276.

Figure 3E:
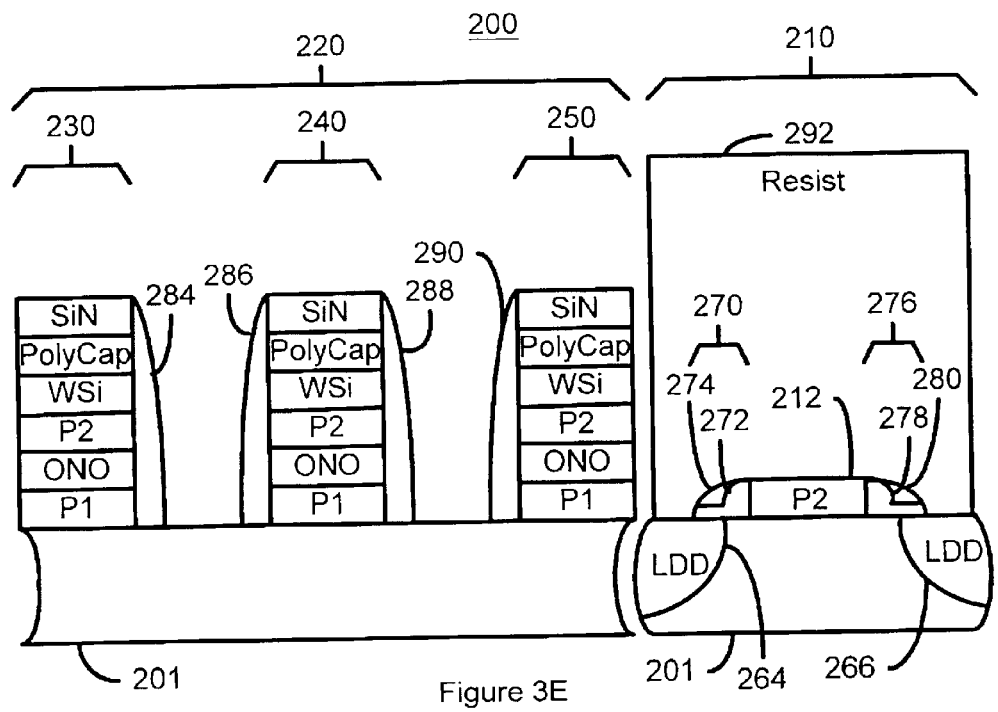

After formation of the periphery spacers 270 and 276, the oxide layer 268 is removed at the core 220, via step 162. Step 162 includes removing the mask 282 that protects the core 220 and providing a mask which protects the periphery 210. Step 162 also preferably includes performing a wet etch on the oxide layer 268. The wet etch stops at the nitride layer 262. Thus, the nitride layer 262 remains substantially intact. The core spacers are formed, via step 164. Step 164 preferably includes anisotropically etching the nitride layer 262 to form the core spacers. FIG. 3E depicts the semiconductor device 200 after formation of the core spacers 284, 286, 288 and 290. The periphery 210 is protected by resist mask 292.

Figure 3F:
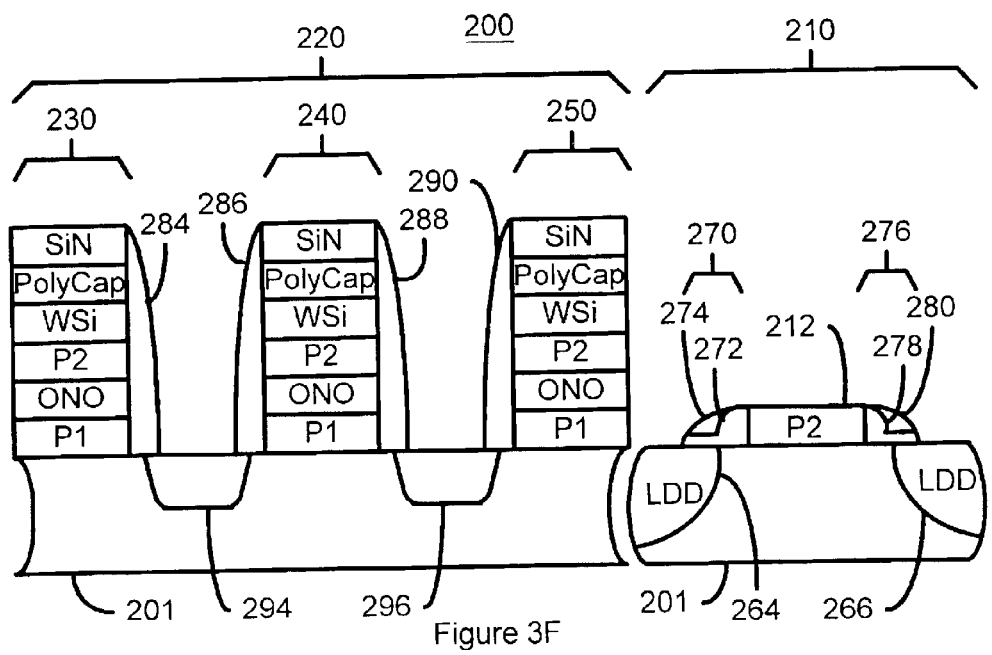

The core junctions are provided, via step 166. Step 166 includes stripping the mask 292 that protects the periphery, providing a core implant mask which protects the periphery and a portion of the core, performing a core N+ implant at the core, and annealing the core N+ implant. FIG. 3F depicts the semiconductor device 200 after step 166 is completed. Thus, drain 294 and source 296 have been formed in the core 220.

Figure 3G:
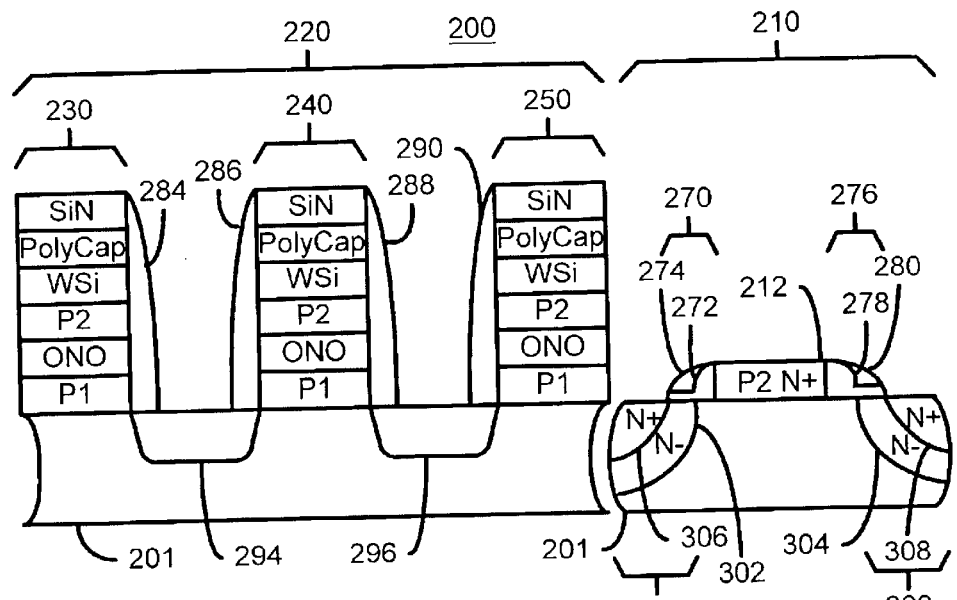

Formation of the periphery junctions is then completed, via step 168. Step 168 includes replacing the core implant mask with an N+ periphery implant mask and providing an N+ implant at the periphery. The N+ periphery implant mask protects the core 220, while exposing a portion of the periphery 210. Step 168 also includes performing an anneal, preferably a rapid thermal anneal (RTA) on the periphery. FIG. 3G depicts the semiconductor device 200 after completion of step 168. Thus, the source and drain regions 298 and 300 have been formed in the periphery 210. The source and drain regions 298 and 300 include N− regions 302 and 304 and N+ regions 306 and 308.

CoSi regions are then formed at least on the source regions 296, via step 170. Step 170 preferably includes a cleaning step, which removes any insulating layers or other contaminants on the source regions 296. Step 170 also includes forming CoSi on the exposed source regions 296.

Figure 3H:
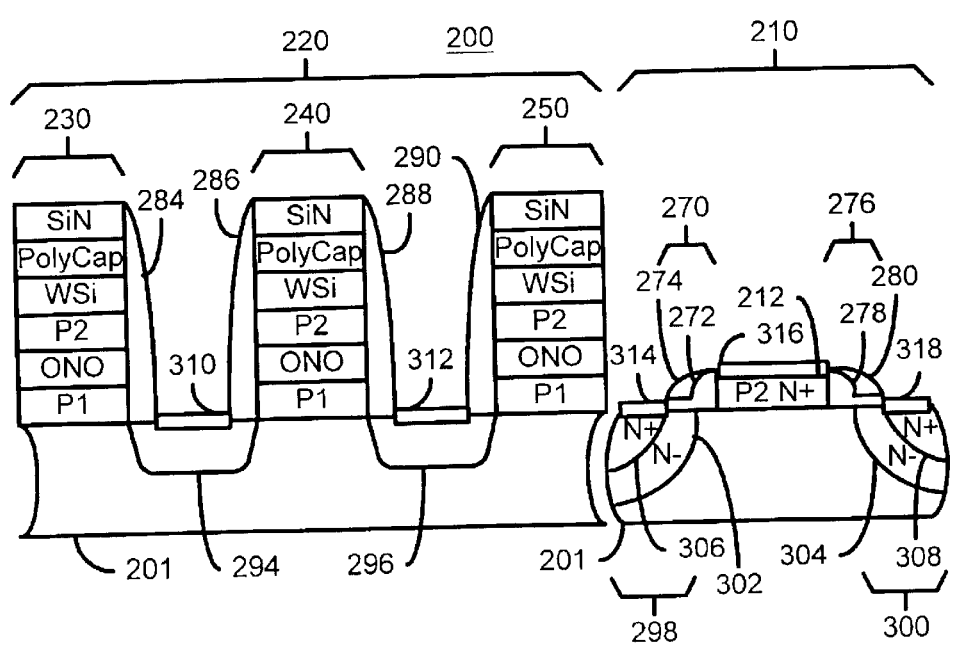

In a preferred embodiment, CoSi regions are also formed on the drain region 294, the source and drain regions 298 and 300, as well as on the gate stacks 212 at the periphery 210. FIG. 3H depicts the semiconductor device 200 after formation of CoSi regions 310, 312, 314, 316 and 318. Fabrication of the semiconductor device 200 can then be completed in a conventional manner, via step 172.

Thus, the core spacers 284, 286, 288 and 290 are formed from the nitride layer 262, while the periphery spacers 270 and 276 are formed from both the nitride layer 262 and the oxide layer 268. Thus, the core spaces 284, 286, 288 and 290 are thinner than the periphery spacers 270 and 276. Because the periphery spacers 270 and 276 are thicker, the periphery spacers 270 and 276 can be used to space the implants performed in step 168, to reduce or eliminate the hot carrier effect at the periphery 210. In addition, because the core spacers 284, 286, 288 and 290 are thinner, the source regions 296 can be exposed and the CoSi formed. Thus, the resistance of the source regions 296 can be lowered. Consequently, the spacers are tailored to the differing requirements of the core 220 and the periphery 210.

A method and system has been disclosed for providing a nonvolatile memory device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device including a substrate, a core and a periphery, the core including a plurality of core gate stacks having a first plurality of edges and the periphery a plurality of periphery gate stacks having a second plurality of edges, the semiconductor device comprising:

a plurality of core spacers at the first plurality of edges, the plurality of core spacers having a thickness;

a plurality of periphery spacers at the second plurality of edges, the plurality of periphery spacers having a second thickness greater than the first thickness;

a plurality of core sources residing between the plurality of core gate stacks; and a plurality of conductive regions on the plurality of core sources.

2. The semiconductor device of claim 1 wherein the plurality of conductive regions include a plurality of CoSi regions.

3. The semiconductor device of claim 1 wherein the plurality of periphery spacers include a first periphery spacer layer and a second periphery spacer layer and wherein the plurality of core spacers include a first core spacer layer, the first core spacer layer and the first periphery spacer layer including a first material.

4. The semiconductor device of claim 3 wherein the first material is nitride and wherein the second periphery spacer layer includes an oxide layer.

5. A method for providing a semiconductor device including a substrate, a core and a periphery, the core including a plurality of core gate stacks having a first plurality of edges and the periphery including a plurality of periphery gate stacks having a second plurality of edges, the method comprising the steps of:

(a) providing a plurality of periphery spacers at the second plurality of edges, the plurality of periphery spacers having a first thickness;

(b) providing a plurality of core spacers at the first plurality of edges, the plurality of core spacers having a second thickness, wherein said first thickness is greater than said second thickness;

(c) providing a plurality of core sources residing between the plurality of core gate stacks; and (d) providing a plurality of conductive regions on the plurality of core sources.

6. The method of claim 5 wherein the step of providing the plurality of conductive regions (d) further includes the step of:

(d1) providing a plurality of CoSi regions.

7. The method of claim 5 wherein the step of providing the plurality of periphery spacers (a) includes the steps of:

(a1) providing a first spacer layer on the core and the periphery;

(a2) providing a second spacer layer on the first spacer layer on the core and the periphery; and (a3) etching the first spacer layer and the second spacer layer at the periphery to provide the plurality of periphery spacers.

8. The method of claim 7 wherein the step of providing the plurality of core spacers (b) further includes the steps of:

(b1) removing the second spacer layer at the core;

(b2) etching the first spacer layer at the core to provide the plurality of core spacers.

9. The method of claim 8 wherein the first spacer layer includes nitride and wherein the second spacer layer includes an oxide layer.

10. A semiconductor device comprising:

a core area; and a periphery area;

wherein said core area comprises:

a plurality of gate stacks; and a plurality of spacers on each side of said plurality of gate stacks in said core area having a first thickness;

wherein said periphery area comprises:

a gate stack; and a plurality of spacers on each side of said gate stack having a second thickness, wherein said second thickness is greater than said first thickness.

11. The semiconductor device as recited in claim 10, wherein said core area further comprises:

a plurality of sources residing between said plurality of gate stacks.

12. The semiconductor device as recited in claim 11, wherein said core area further comprises:

a plurality of conductive regions residing on said plurality of sources.

13. The semiconductor device as recited in claim 10, wherein said plurality of spacers on each side of said plurality of gate stacks in said core area comprises a first spacer layer, wherein said plurality of spacers on each side of said gate stack in said periphery area comprises said first spacer and a second spacer layer.

14. The semiconductor device as recited in claim 13, wherein said first spacer layer comprises nitride, wherein said second spacer layer comprises an oxide layer.

15. A method for tailoring core and periphery cells in a nonvolatile memory comprising the steps of:

depositing an oxide liner over a plurality of gate stacks in a core area and over a gate stack in a periphery area;

depositing a nitride layer over said oxide liner;
depositing an oxide layer over said nitride liner;
providing a mask to protect said core area;
forming a plurality of spacers on each side of said gate stack in said periphery area having a first thickness;
removing said mask to protect said core area;
providing a mask to protect said periphery area;
etching said oxide layer in said core area; and
forming a plurality of spacers on each side of said plurality of gate stacks in said core area having a second thickness, wherein said second thickness is less than said first thickness.

16. The method as recited in claim 15 further comprising the steps of:

forming a plurality of sources residing between said plurality of gate stacks in said core area; and forming a plurality of conductive regions on said plurality of sources in said core area.

* * * * *

UNITED STATES PATENT AND TRADEMARK OFFICE
CERTIFICATE OF CORRECTION

PATENT NO. : 6,808,992 B1
DATED : October 26, 2004
INVENTOR(S) : Kelwin Ko et al.

It is certified that error appears in the above-identified patent and that said Letters Patent is hereby corrected as shown below:

Column 2,
Line 44, following "herein." please insert a new paragraph.

Signed and Sealed this

Seventeenth Day of May, 2005

JON W. DUDAS
*Director of the United States Patent and Trademark Office*